United States Patent
Smith et al.

(10) Patent No.: US 10,637,387 B2
(45) Date of Patent: Apr. 28, 2020

(54) MOTOR CONTROL DEVICE

(71) Applicant: Franklin Electric Co., Inc., Fort Wayne, IN (US)

(72) Inventors: Terry A. Smith, Fort Wayne, IN (US); Andrew C. Grubbs, Fort Wayne, IN (US); Robert L. Wetekamp, Fort Wayne, IN (US)

(73) Assignee: Franklin Electric Co., Inc., Fort Wayne, IN (US)

(*) Notice: Subject to any disclaimer, the term of this patent is extended or adjusted under 35 U.S.C. 154(b) by 0 days.

(21) Appl. No.: 16/062,003

(22) PCT Filed: Dec. 15, 2016

(86) PCT No.: PCT/US2016/067041
§ 371 (c)(1),
(2) Date: Jun. 13, 2018

(87) PCT Pub. No.: WO2017/106570
PCT Pub. Date: Jun. 22, 2017

(65) Prior Publication Data
US 2018/0367079 A1 Dec. 20, 2018

Related U.S. Application Data

(60) Provisional application No. 62/267,897, filed on Dec. 15, 2015.

(51) Int. Cl.
*H02P 25/00* (2006.01)
*H02P 27/048* (2016.01)
(Continued)

(52) U.S. Cl.
CPC ............ *H02P 27/048* (2016.02); *F04D 13/06* (2013.01); *H02P 23/00* (2013.01); *H02P 25/04* (2013.01);
(Continued)

(58) Field of Classification Search
CPC . F04D 13/06; F04D 13/16; F04D 1/00; H02P 25/04; H02P 27/048
(Continued)

(56) References Cited

U.S. PATENT DOCUMENTS

| 5,610,493 A | 11/1997 | Wieloch | |
|---|---|---|---|
| 2006/0180647 A1* | 8/2006 | Hansen | B60S 3/00 235/375 |

(Continued)

FOREIGN PATENT DOCUMENTS

WO    2017180484    10/2017

OTHER PUBLICATIONS

Prior to Dec. 18, 2015, it was known to repair a malfunctioning QD Control Box by replacing the malfunctioning cover of the QD Control Box with the cover of a new QD Control box.

(Continued)

*Primary Examiner* — Bickey Dhakal
*Assistant Examiner* — Gabriel Agared
(74) *Attorney, Agent, or Firm* — Faegre Drinker Biddle & Reath LLP (57) ABSTRACT

A method and system to convert a constant speed motor drive (40) into a variable speed motor drive (80) are disclosed. The method comprises disconnecting a second terminal (68) from a first terminal (54) by removing from the constant speed motor drive (40) a first cover assembly (46) comprising the second terminal (68), the constant speed motor drive (40) comprising the first cover assembly (46) and a base assembly (42) including the first terminal (54), the cover assembly further comprising a constant speed controller (66), the first terminal (54) adapted to receive an alternating-current (AC) voltage and including motor contacts operable to output a motor voltage, wherein the constant speed controller (66) generates the motor voltage for (Continued)

the motor contacts when the constant speed controller (66) operates; and connecting a third terminal (68) to the first terminal (54) by coupling a second cover assembly (82) to the base assembly (42), the second cover assembly (82) comprising the third terminal (68) and a variable speed controller (100) electrically coupled to the third terminal (68).

14 Claims, 7 Drawing Sheets (51) Int. Cl.
    *H05K 7/14*     (2006.01)
    *H02P 23/00*     (2016.01)
    *F04D 13/06*     (2006.01)
    *H02P 25/04*     (2006.01)
    *F04D 1/00*     (2006.01)
    *F04D 13/16*     (2006.01)

(52) U.S. Cl.
    CPC ............. *H05K 7/1432* (2013.01); *F04D 1/00* (2013.01); *F04D 13/16* (2013.01)

(58) Field of Classification Search
    USPC .......................................................... 318/816
    See application file for complete search history.

(56) References Cited

U.S. PATENT DOCUMENTS

| | | | |
|---|---|---|---|
| 2012/0262093 A1* | 10/2012 | Recker | H05B 33/0854 |
| | | | 315/308 |
| 2013/0294949 A1 | 11/2013 | Blaser et al. | |
| 2017/0331177 A1* | 11/2017 | MacCallum | B64B 1/48 |
| 2018/0048149 A1* | 2/2018 | Testani | G05F 1/00 |
| 2018/0058463 A1* | 3/2018 | Rollins | F04D 25/0606 |
| 2019/0174687 A1 | 6/2019 | Lynn et al. | |

OTHER PUBLICATIONS

Franklin Electric, Submersible Motor Control Boxes, 2 pages, Mar. 2009.

Franklin Electric, QD Service Manual, 4 pages, Mar. 2006.

* cited by examiner

MOTOR CONTROL DEVICE

CROSS-REFERENCE TO RELATED APPLICATIONS

The present application is a § 371 National phase entry of International Application No. PCT/US2016/067041, titled MOTOR CONTROL SYSTEM AND METHOD, filed on Dec. 15, 2016, which claims the benefit of U.S. Patent Application No. 62/267,897, filed on Dec. 15, 2015, both applications incorporated herein in their entirety by reference.

FIELD OF THE DISCLOSURE

Systems, controllers, and methods of using motor controllers.

BACKGROUND

Fluid supply systems use motors to drive pumps and transfer fluids from supply reservoirs, such as wells, to demand reservoirs, such as tanks. A sensor measures a characteristic of the fluid, and a motor controller controls operation of the motor. A motor controller may operate the motor at a constant speed. When pressure reaches a low pressure limit, the motor controller turns on the motor and keeps the motor running until pressure reaches a high pressure limit, at which time the motor controller turns the motor off. The difference between the high and low pressure limits can be about 20 PSI. If the motor controller is a constant speed controller, then the motor runs at a speed determined by the frequency of the line voltage powering the motor controller.

The pressure variation generated by a control system with a constant speed controller can be detrimental. For example, the pressure variation affects how long it takes to fill a dish-washer or clothes-washer in a home. Near the high pressure the filling cycle is quicker than near the low pressure. Pressure variation is also undesirable in irrigation systems, because the reach of the irrigation heads depends on water pressure. As pressure decreases, the reach of the irrigation head is reduced. To compensate for the reduction additional irrigation heads may be added, increasing cost and resulting in overwatering of some areas to ensure proper watering of others, which wastes water.

It is desirable to replace constant speed controllers with variable speed controllers to reduce pressure variation and improve performance of the water supply system. However such replacement requires labor to remove the old controller and install the new controller, which can dissuade owners from switching controllers. Accordingly it is desirable to improve motor controllers to facilitate upgrades without incurring labor costs and complexity that may dissuade owners from performing the upgrades.

The background to the disclosure is described herein, including reference to documents, acts, materials, devices, articles and the like, to explain the context of the present invention. This is not to be taken as an admission or a suggestion that any of the material referred to was published, known or part of the common general knowledge in the art to which the present invention pertains, in the United States or in any other country, as at the priority date of any of the claims.

SUMMARY OF DISCLOSED EMBODIMENTS

A method and system to convert a constant speed motor drive into a variable speed motor drive are disclosed. In some embodiments, the method comprises disconnecting a second terminal from a first terminal by removing from the constant speed motor drive a first cover assembly comprising the second terminal, the constant speed motor drive comprising the first cover assembly and a base assembly including the first terminal, the first cover assembly further comprising a constant speed controller; and connecting a third terminal to the first terminal by coupling a second cover assembly to the base assembly, the second cover assembly comprising the third terminal and a variable speed controller electrically coupled to the third terminal.

In some embodiments, the method comprises disconnecting a second terminal from a first terminal by removing from the constant speed motor drive a first cover assembly comprising the second terminal, the constant speed motor drive comprising the first cover assembly and a base assembly including the first terminal, the first cover assembly further comprising a constant speed controller; and connecting a third terminal to the first terminal by coupling a second cover assembly to the base assembly, the second cover assembly comprising the third terminal and a variable speed controller electrically coupled to the third terminal, whereby removing the first cover assembly and coupling the second cover assembly from/to the base assembly converts the constant speed motor drive into the variable speed motor drive.

In some embodiments, the method comprises disconnecting a second terminal from a first terminal by removing from the constant speed motor drive a first cover assembly comprising the second terminal, the constant speed motor drive comprising the first cover assembly and a base assembly including the first terminal, the first cover assembly further comprising a constant speed controller, the first terminal adapted to receive an alternating-current (AC) voltage and including motor contacts operable to output a motor voltage, wherein the constant speed controller generates the motor voltage for the motor contacts when the constant speed controller operates; and connecting a third terminal to the first terminal by coupling a second cover assembly to the base assembly, the second cover assembly comprising the third terminal and a variable speed controller electrically coupled to the third terminal, wherein the variable speed controller generates the motor voltage for the motor contacts when the variable speed controller operates.

In one embodiment, the method comprises disconnecting a second terminal from a first terminal by removing from the constant speed motor drive a first cover assembly comprising the second terminal, the constant speed motor drive comprising the first cover assembly and a base assembly including the first terminal, the first cover assembly further comprising a constant speed controller, the first terminal adapted to receive an alternating-current (AC) voltage and including motor contacts operable to output a motor voltage, wherein the constant speed controller generates the motor voltage for the motor contacts when the constant speed controller operates; and connecting a third terminal to the first terminal by coupling a second cover assembly to the base assembly, the second cover assembly comprising the third terminal and a variable speed controller electrically coupled to the third terminal, wherein the variable speed controller generates the motor voltage for the motor contacts when the variable speed controller operates, whereby removing the first cover assembly and coupling the second cover assembly from/to the base assembly converts the constant speed motor drive into the variable speed motor drive.

In some embodiments, a motor control system comprises a variable speed motor drive comprising a base assembly coupled to a second cover assembly, the base assembly including a first terminal sized and configured to receive an alternating-current (AC) voltage from a power source and to provide a motor voltage to a motor; and the second cover assembly including a third terminal sized and configured to electrically couple with the first terminal, the second cover assembly further including a variable speed controller powered by the AC voltage and generating the motor voltage.

In one embodiment, a motor control system comprises a variable speed motor drive comprising a base assembly coupled to a second cover assembly, the base assembly including a first terminal sized and configured to receive an alternating-current (AC) voltage from a power source and to provide a motor voltage to a motor; and the second cover assembly including a third terminal sized and configured to electrically couple with the first terminal, the second cover assembly further including a variable speed controller powered by the AC voltage and generating the motor voltage, whereby substitution with the second cover assembly of a first cover assembly comprising a second terminal sized and configured to electrically couple with the first terminal and a constant speed controller retrofits a constant speed motor drive into a variable speed motor drive.

DESCRIPTION OF THE DRAWINGS

The features and advantages of the disclosure will become more readily appreciated as the same become better understood by reference to the following detailed description when taken in conjunction with the accompanying drawings, where.

Corresponding reference characters indicate corresponding parts throughout the several views. Although the drawings represent embodiments of various features and components according to the present invention, the drawings are not necessarily to scale and certain features may be exaggerated in order to better illustrate and explain the present invention.

DETAILED DESCRIPTION

For the purposes of promoting an understanding of the principles of the disclosure, reference will now be made to the embodiments illustrated in the drawings, which are described below. The embodiments disclosed below are not intended to be exhaustive or limit the claims to the precise form disclosed in the following detailed description. Rather, the embodiments are chosen and described so that others skilled in the art may utilize their teachings. It will be understood that no limitation of the scope of the claims is thereby intended. The present invention includes any alterations and further modifications in the illustrated devices and described methods and further applications of the principles of the disclosure which would normally occur to one skilled in the art to which the disclosure relates.

Except where a contrary intent is expressly stated, terms are used in their singular form for clarity and are intended to include their plural form.

As used herein, the terms "comprises," "comprising," "containing," and "having" and the like denote an open transition meaning that the claim in which the open transition is used is not limited to the elements following the transitional term. The terms "consisting of" or "consists of" denote closed transitions.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

Occurrences of the phrase "in one embodiment," or "in one aspect," herein do not necessarily all refer to the same embodiment or aspect.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Figure 1:
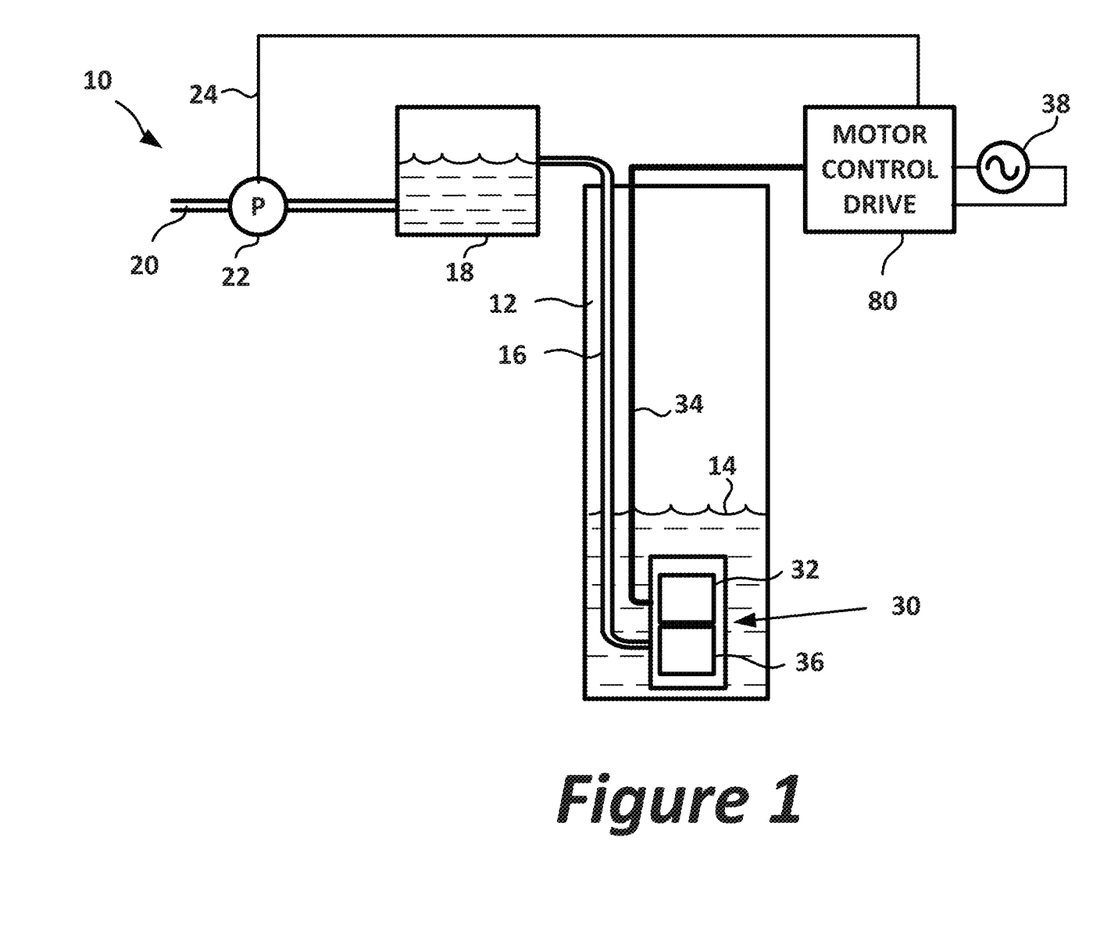
FIG. 1 is a diagrammatic representation of an embodiment of a liquid supply system.

Embodiments of the disclosure, and others, will now be described with reference to the figures. FIG. 1 illustrates a typical liquid supply system 10 comprising a reservoir 12 containing a liquid 14 which is pumped by a pump unit 30 through a conduit 16 into a reservoir 18. Pump unit 30 includes a pump 36 driven by a motor 32 which is powered by a variable speed motor drive 80 through a connector 34. Reservoir 12 may be a deep-well. Motor 32 may be a conventional single-phase induction motor and pump 36 may be a conventional centrifugal pump. Conductors 34 may comprise two or three wires to provide power to motor 32. A conventional one-way check valve (not shown) may be provided between pump 36 and reservoir 16 to prevent backflow of liquid 14. During operation of the system, liquid flows out of reservoir 18 through a conduit 20. A pressure sensor 22 is disposed in conduit 20 and provides a pressure signal through line 24 to variable speed motor drive 80. Reservoir 10 may be an aboveground or underground tank, a well casing, or any other reservoir containing liquid 14. In some embodiments, reservoir 18 comprises a pressurized tank.

Figure 2:
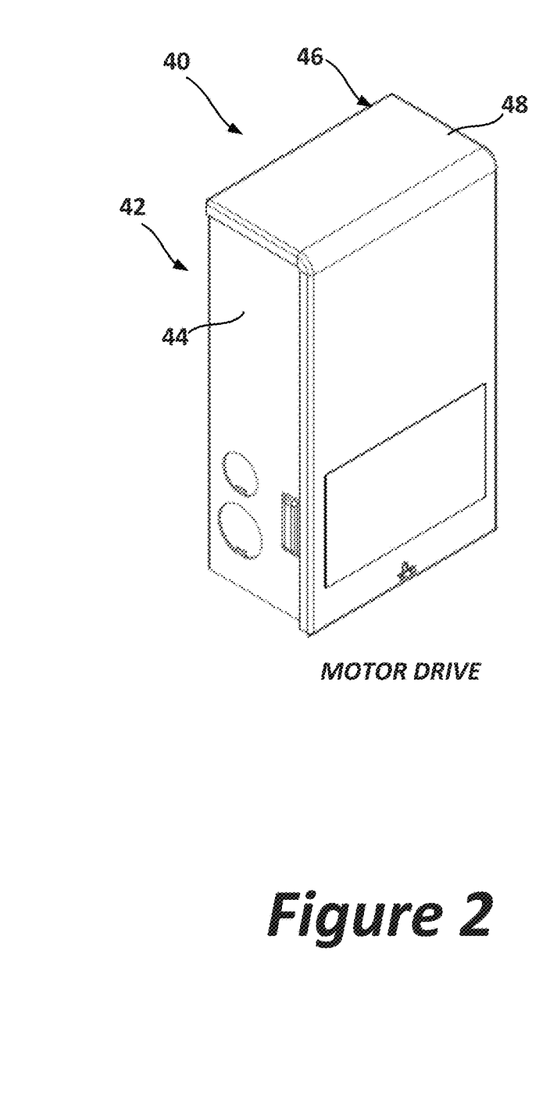
FIGS. 2 to 4 are perspective views of an embodiment of a constant speed motor drive.
Figure 3:
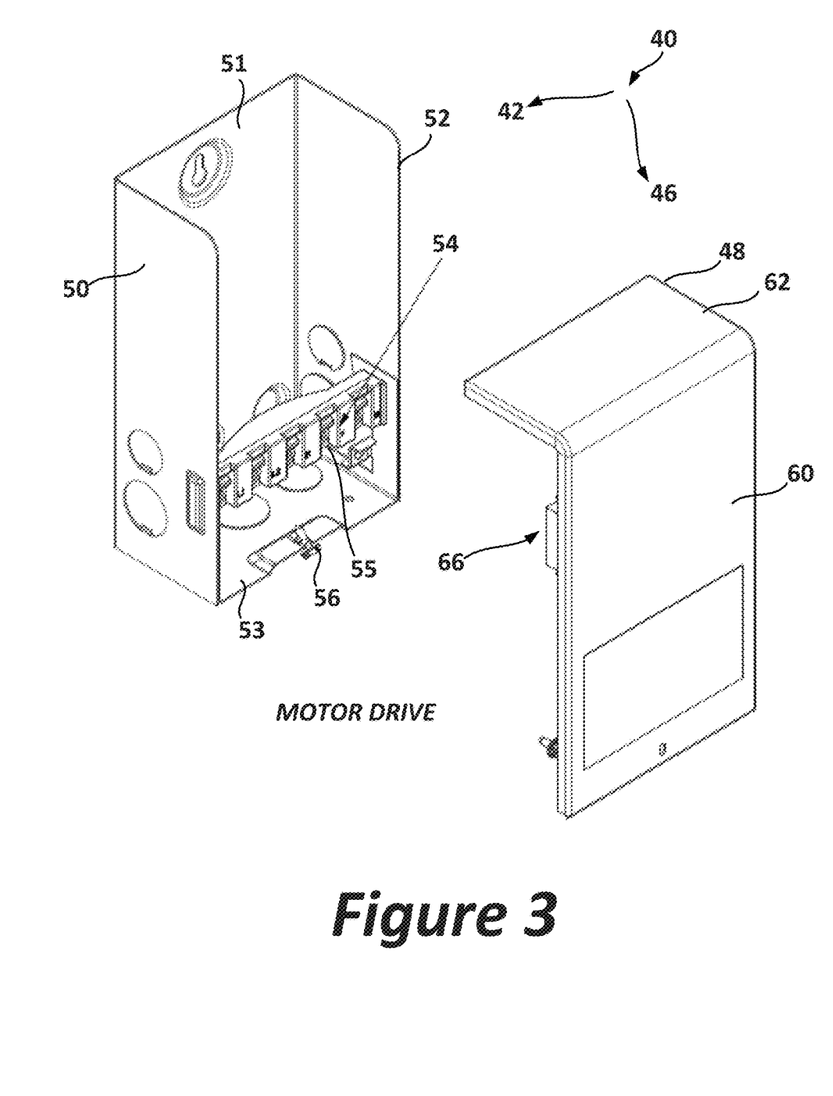
Figure 4:
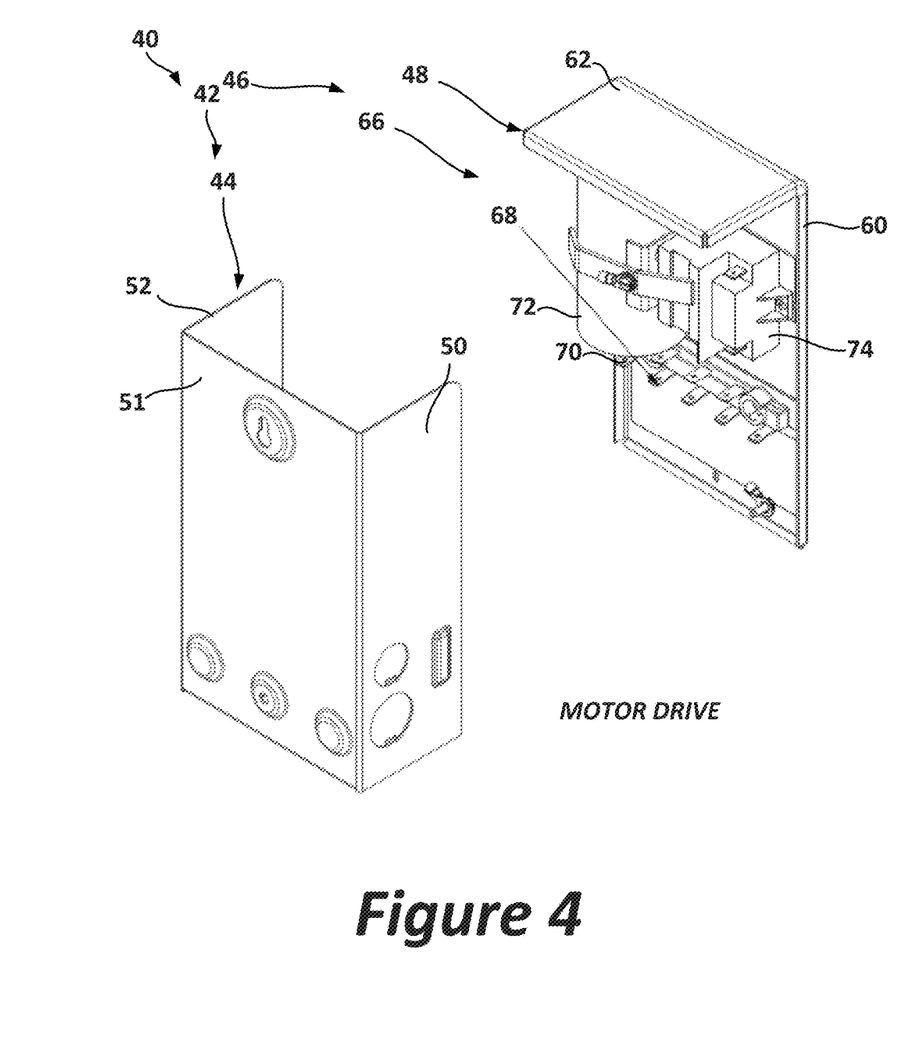

FIGS. 2 to 4 are perspective views of a constant speed motor drive 40 including a base assembly 42 and a first cover assembly 46. Base assembly 42 comprises a base 44 including a back wall 51, side walls 50 and 52, and a bottom wall 53. A first terminal 54 is supported by base 44. As shown, first terminal 54 includes five connectors 55. Base assembly 42 is mounted on a support structure. Conductors from an AC source (L1, L2) and to the motor (R, Y, B) are connected to first terminal 54. A ground connector 56, illustratively a screw connected to ground, is also provided. First terminal 54 includes plug-in connections for a mating terminal, respectively second terminal 68 and third terminal 98, described below. In other embodiments, more or less connectors may be provided, for example for two-wire single-phase motors.

First cover assembly 46 includes cover 48 having a front wall 60 and a top wall 62, also includes second terminal 68 and a constant speed controller 66. First cover assembly 46 attaches to base assembly 42 to form an enclosure for constant speed controller 66. Second terminal 68 includes contacts 70 that plug into first terminal 54 when first cover assembly 46 is attached to base assembly 42. Constant speed controller 66 comprises a capacitor 72 and a circuit 74 including a reed switch and a triac. Circuit 74 and capacitor 72 produce a start winding voltage that lags the main voltage provided to the motor, to start the motor. The foregoing description of constant speed controller 66 represents one example. Any circuit configured to provide a constant voltage to a motor may be used instead.

Power from the AC source is coupled in series through a pressure switch 120 (shown in FIG. 7) to connectors L1, L2 of first terminal 54. When engaged, constant speed controller 66 provides power to motor 32 through connectors B, Y, R. As described above, pressure switch 120 closes when pressure is below the low pressure limit and opens when pressure is above the high pressure limit. When pressure switch 120 is closed power is supplied to motor 32 by constant speed controller 66 to provide the motor power based on the frequency of the line voltage of power source 38. Thus if the line frequency is 60 Hz the motor will run at a speed corresponding to the 60 Hz, minus any variation due to the load on the motor, e.g. a pump. By constant speed it is meant, therefore, that the voltage provided to the motor is substantially constant (may comprise line voltage fluctuations), which for a constant load equates to a substantially constant motor speed.

Figure 5:
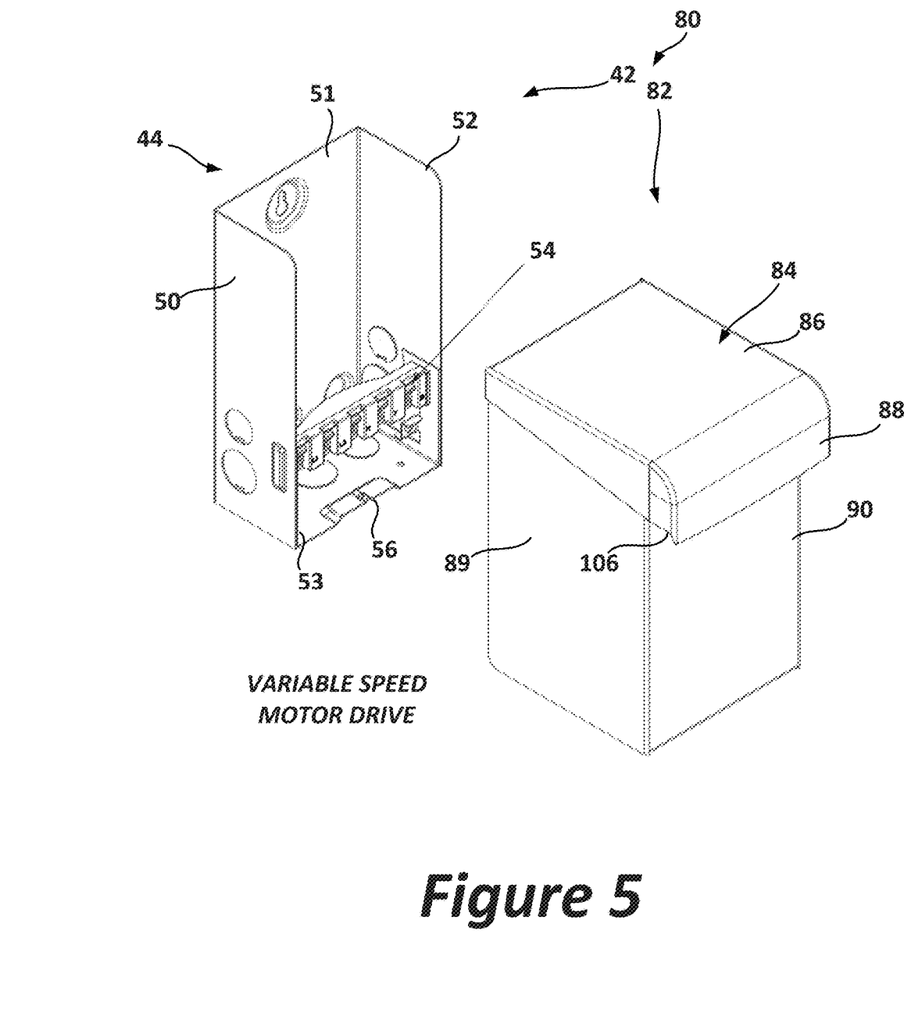
FIGS. 5 and 6 are perspective views of an embodiment of a variable speed motor drive.
Figure 6:
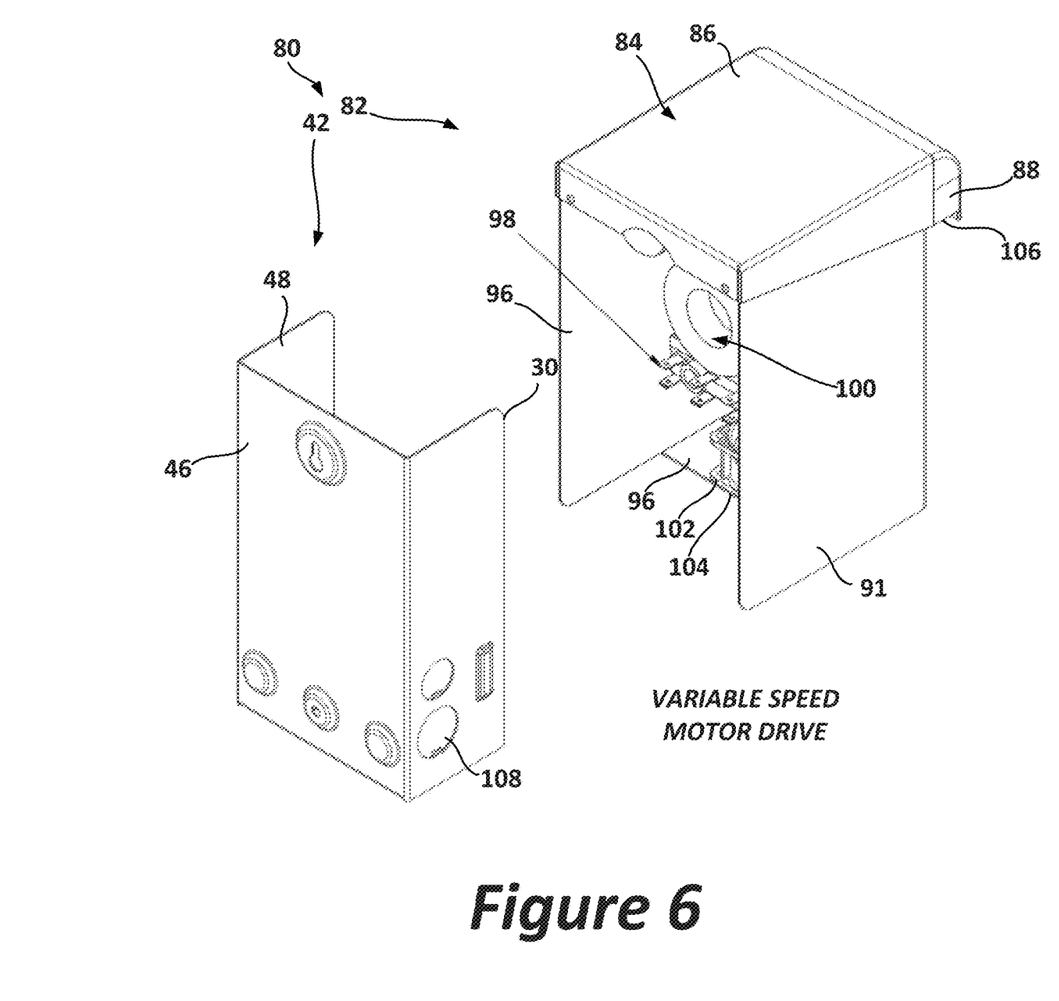

FIGS. 5 and 6 are perspective views of variable speed motor drive 80. Variable speed motor drive 80 includes base assembly 42, including first terminal 54 and ground connector 56, and second cover assembly 82 including a cover 84 supporting a third terminal 98 and a variable speed controller 100. Cover 84 includes a hood 86 having a front portion 88, a front wall 90, and side walls 89 and 91. Hood 86 may be fixedly attached or integrally constructed with side walls 89 and 91. Cover 84 further includes a variable speed controller 100, a fan 102, and an opening 104 in a bottom wall 96. Another opening, 106, is formed between front portion 88 and front wall 90. Fan 102 draws air through opening 104 and forces the air through variable speed controller 100 to draw heat therefrom. The heated air is then blown through opening 106, thereby cooling variable speed controller 100.

Variable speed controller 100 may comprise a variable frequency drive operable in conjunction with pressure transducer 22 to maintain a pressure of liquid supply system 10 about a setpoint. Line 24 may convey the pressure signal to variable speed motor drive 80

Line 24 may be introduced to base assembly 42 through a knock-out and fixedly attached thereto with a suitable connector well known in the art for attaching conductors passing through knock-outs, e.g. knock-out 108. In one embodiment, line 24 is connected directly to variable speed controller 100, tethering second cover assembly 82 to base assembly 42. In some embodiments, a quick-disconnect connector may be provided instead to avoid tethering. Variable speed controller 100 may be any known or future developed variable frequency drive. Examples of variable frequency drives are disclosed in commonly-owned International Patent Application No. PCT/US2014/046820, having an international filing date of Jul. 16, 2014, titled "Enclosure with wireless communication features", and International Patent Application No. PCT/US2014/053231, having an international filing date of Aug. 28, 2014, titled "Motor drive system and method", both international patent applications incorporated by reference herein in their entirety. As described therein, a wireless modem may be provided to configure the variable speed controller with a portable electronic device without removing the cover. Additionally, performance information can be obtained wirelessly from the variable speed drive and transmitted via the internet. Any of the additional features provided in the variable speed drives (i.e. controllers) described therein may be implemented in the variable speed controllers described herein.

Advantageously, second cover assembly 82 is configured to replace first cover assembly 46 while utilizing the same base assembly 42. Thus, the connections to the motor and to the power source are not disturbed. Accordingly, a constant speed motor drive can be retrofitted to provide improved pressure control via a variable speed controller with minimal effort and cost. The variable speed controllers are suitable to operate AC motors of various sizes, e.g. ½, ¾, 1, 1.5 HP and others, via two or three wire connections. The variable speed controllers may also be used with surface motors and other applications in which motors are used. Indicators may be provided on the cover, e.g. light emitting diodes or a display, to indicate that the variable speed controller is operating properly or to indicate a fault.

Figure 7:
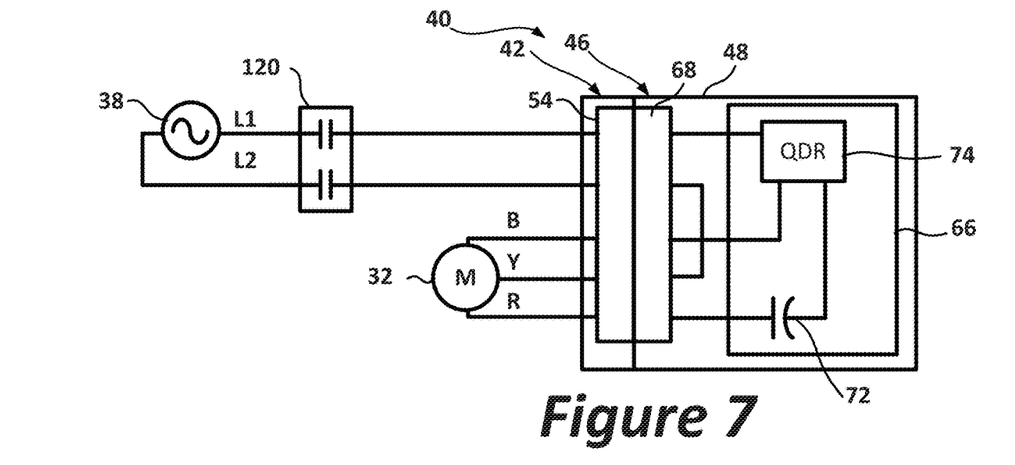
FIGS. 7 and 8 are schematic diagrams of embodiments of a constant speed motor drive and a variable speed motor drive wired in a liquid supply system.
Figure 8:
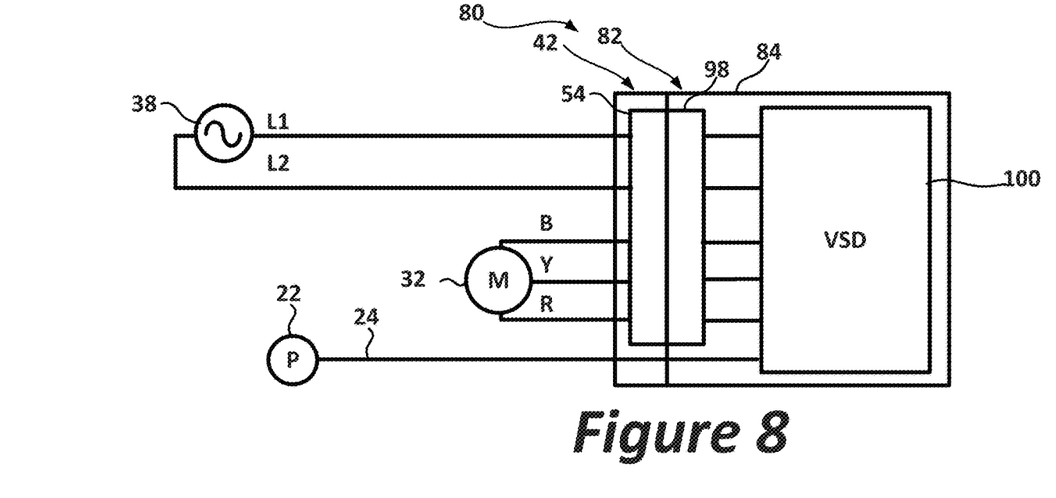
Figure 9:
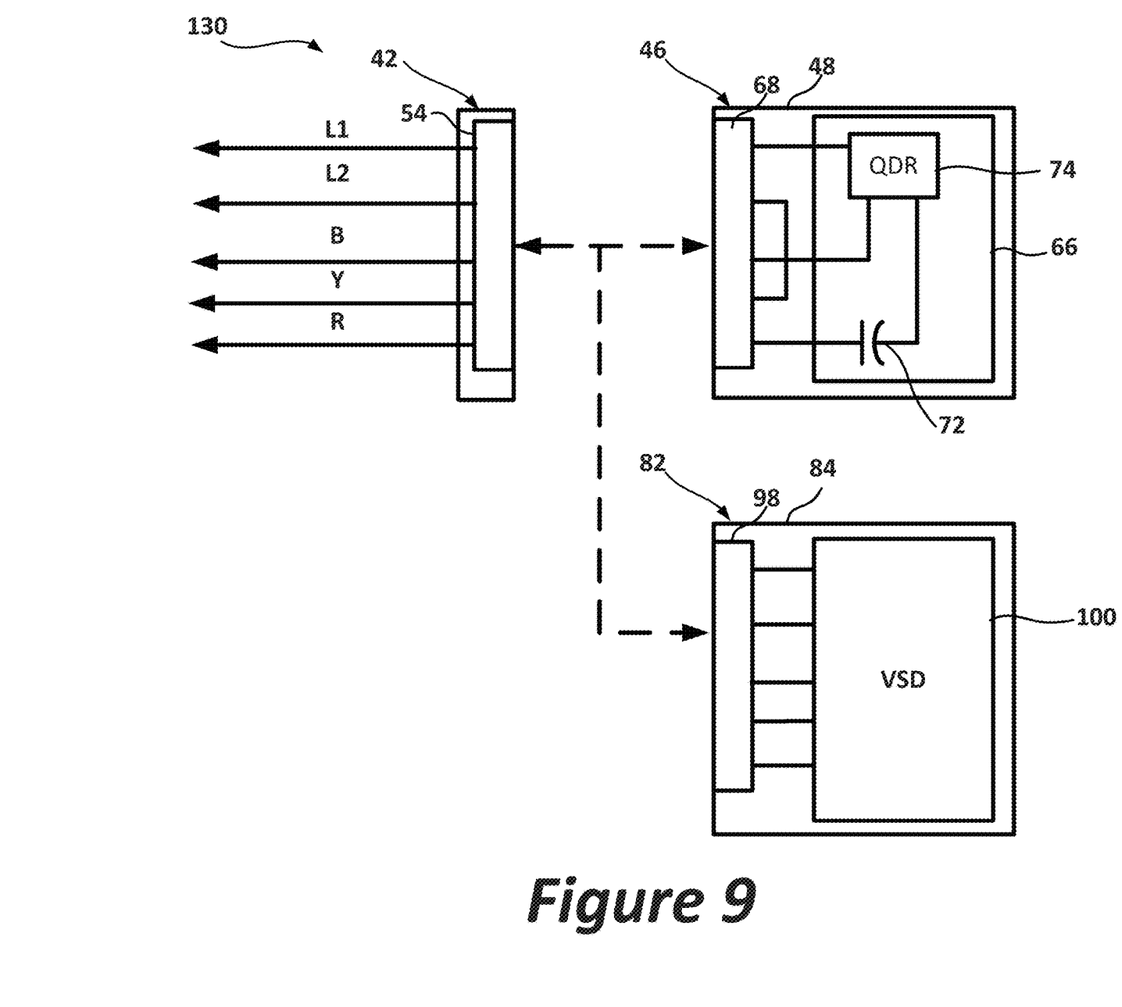
FIG. 9 is a schematic diagram of an embodiment of a motor control system.

FIGS. 7 and 8 are schematic diagrams of constant speed motor drive 40 and variable speed motor drive 80, respectively, electrically coupled to power source 38 and motor 32. FIG. 7 illustrates an embodiment in which pressure switch 120 is interposed between power source 38 and constant speed motor drive 40 in series. Other variations are possible depending on the type of pressure switch or transducer used to indicate to constant speed motor drive 40 of the need to engage the motor. FIG. 8 illustrates how the connections to terminal 54 from power source 38 and motor 32 are remain unchanged after substitution of first cover assembly 46 by second cover assembly 82. FIG. 9 illustrates a system 130 comprising constant speed motor drive 40 and second cover assembly 82 as described herein. Advantageously, system 130 solves the problems described above with reference to a constant speed motor drive by providing a simple and cost effective method to upgrade the constant speed motor drive to a variable speed motor drive.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A method to convert a constant speed motor drive into a variable speed motor drive, the method comprising:
disconnecting a second terminal from a first terminal by removing from the constant speed motor drive, a first cover assembly comprising the second terminal, the constant speed motor drive comprising the first cover assembly and a base assembly including the first terminal, the first cover assembly further comprising a constant speed controller, the first terminal adapted to receive an alternating-current (AC) voltage and including motor contacts operable to output a motor voltage, wherein the constant speed controller generates the motor voltage for the motor contacts when the constant speed controller operates; and connecting a third terminal to the first terminal by coupling a second cover assembly to the base assembly, the second cover assembly comprising the third terminal and a variable speed controller electrically coupled to the third terminal, wherein the variable speed controller generates the motor voltage for the motor contacts when the variable speed controller operates, whereby removing the first cover assembly and coupling the second cover assembly from/to the base assembly converts the constant speed motor drive into the variable speed motor drive.

2. The method of claim 1, further comprising maintaining unchanged connections of power cables and motor cables to the first terminal.

3. The method of claim 1, wherein connecting the third terminal to the first terminal comprises plugging the third terminal into the first terminal.

4. The method of claim 1, wherein the variable speed controller comprises the third terminal.

5. The method of claim 1, wherein a pressure switch is connected in series between a source of AC power and the constant speed motor drive, further comprising connecting the source of AC power to the constant speed motor drive without the pressure switch therebetween.

6. The method of claim 1, further comprising electrically coupling a pressure transducer to the variable speed controller.

7. The method of claim 1, wherein the motor voltage generated by the constant speed controller comprises a frequency of the AC voltage.

8. A motor control system comprising:
a variable speed motor drive comprising a base assembly coupled to a second cover assembly,
the base assembly including a first terminal sized and configured to receive an alternating-current (AC) voltage from a power source and to provide a motor voltage to a motor; and
the second cover assembly including a third terminal sized and configured to electrically couple with the first terminal, the second cover assembly further including a variable speed controller powered by the AC voltage and generating the motor voltage,
whereby substitution with the second cover assembly of a first cover assembly retrofits a constant speed motor drive into the variable speed motor drive, the first cover assembly comprising a constant speed controller and a second terminal electrically coupled with the constant speed controller, the second terminal sized and configured to electrically couple with the first terminal.

9. The motor control system of claim 8, further comprising the first cover assembly.

10. The motor control system of claim 8, wherein substitution with the second cover assembly of the first cover assembly retrofits the constant speed motor drive into the variable speed motor without changing connections of power cables and motor cables to the first terminal.

11. The motor control system of claim 8, wherein the third terminal is sized and configured to mate with the first terminal.

12. The motor control system of claim 11, wherein the third terminal is sized and configured to plug into the first terminal.

13. The motor control system of claim 8, wherein the variable speed controller comprises the second terminal.

14. The motor control system of claim 8, wherein the motor voltage generated by the constant speed controller comprises a frequency of the AC voltage.

* * * * *